(12) United States Patent
Tu et al.

(10) Patent No.: US 10,164,141 B2
(45) Date of Patent: Dec. 25, 2018

(54) IMAGE SENSOR DEVICE WITH DAMAGE REDUCTION

(71) Applicant: TAIWAN SEMICONDUCTOR MANUFACTURING CO., LTD., Hsinchu (TW)

(72) Inventors: Chien-Nan Tu, Kaohsiung (TW); Yu-Lung Yeh, Kaohsiung (TW); Hsing-Chih Lin, Tainan (TW); Chien-Chang Huang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/332,124

(22) Filed: Jul. 15, 2014

(65) Prior Publication Data
US 2016/0020244 A1    Jan. 21, 2016

(51) Int. Cl.
*H01L 21/00* (2006.01)
*H01L 21/76* (2006.01)
*H01L 31/18* (2006.01)
*H01L 31/101* (2006.01)
*H01L 27/146* (2006.01)

(52) U.S. Cl.
CPC ...... *H01L 31/1864* (2013.01); *H01L 27/1469* (2013.01); *H01L 27/14625* (2013.01); *H01L 27/14634* (2013.01); *H01L 27/14685* (2013.01); *H01L 27/14698* (2013.01); *H01L 31/101* (2013.01); *H01L 31/1804* (2013.01); *H01L 31/1892* (2013.01); *H01L 27/14621* (2013.01); *Y02E 10/547* (2013.01); *Y02P 70/521* (2015.11)

(58) Field of Classification Search
CPC ......... H01L 27/14625; H01L 27/14634; H01L 27/14685; H01L 27/1469; H01L 27/14698; H01L 27/14621; H01L 31/028; H01L 31/1804; H01L 31/1864; H01L 31/1892; H01L 31/101; Y02E 10/547; Y02P 70/521
See application file for complete search history.

(56) References Cited

U.S. PATENT DOCUMENTS

| | | | | |
|---|---|---|---|---|
| 2005/0074954 | A1* | 4/2005 | Yamanaka | H01L 27/14618 438/458 |
| 2005/0258423 | A1* | 11/2005 | Kuwabara | H01L 27/1214 257/66 |
| 2006/0180860 | A1* | 8/2006 | Pan | H01L 27/14618 257/347 |
| 2006/0228846 | A1* | 10/2006 | Endo | C30B 29/06 438/197 |

(Continued)

*Primary Examiner* — Su C Kim
(74) *Attorney, Agent, or Firm* — Maschoff Brennan

(57) ABSTRACT

A semiconductor device includes a carrier wafer, a device layer, a first semiconductor layer and a second semiconductor layer. The device layer is disposed on the carrier wafer. The first semiconductor layer is disposed on the device layer, and has a first side face and a second side face opposite to the first side face, in which the first side face is adjacent to the device layer. The second semiconductor layer is disposed on the first semiconductor layer, and has a third side face and a fourth side face opposite to the third side face, in which the fourth side face of the second semiconductor layer is adjacent to the second side face of the first semiconductor layer, and the second semiconductor layer is implanted and annealed.

20 Claims, 12 Drawing Sheets

(56) References Cited

U.S. PATENT DOCUMENTS

| | | | |
|---|---|---|---|
| 2008/0128751 A1* | 6/2008 | Langdo | H01L 21/28518 257/191 |
| 2008/0296598 A1* | 12/2008 | Wang | H01L 33/44 257/98 |
| 2009/0079000 A1* | 3/2009 | Yamazaki | H01L 23/433 257/351 |
| 2009/0294812 A1* | 12/2009 | Gambino | H01L 27/14641 257/292 |
| 2011/0201176 A1* | 8/2011 | Ramappa | H01L 21/76254 438/458 |
| 2012/0168793 A1* | 7/2012 | Tsang | H01L 33/405 257/98 |
| 2013/0020662 A1* | 1/2013 | Kao | H01L 27/14632 257/431 |
| 2013/0134576 A1* | 5/2013 | Hayashi | H01L 21/02697 257/734 |
| 2014/0339614 A1* | 11/2014 | Fang | H01L 27/1461 257/292 |
| 2015/0357325 A1* | 12/2015 | Ding | H01L 27/0694 257/347 |

* cited by examiner

IMAGE SENSOR DEVICE WITH DAMAGE REDUCTION

BACKGROUND

Semiconductor image sensors are operated to sense light. Typically, the semiconductor image sensors include complementary metal-oxide-semiconductor (CMOS) image sensors (CIS) or charge-coupled device (CCD) sensors, which are widely used in various applications such as digital still camera (DSC), mobile phone camera, digital video (DV) and digital video recorder (DVR) applications. These semiconductor image sensors utilize an array of image sensor elements, each image sensor element including a photodiode and other elements, to absorb light and convert the sensed light into digital data or electrical signals.

A back side illuminated (BSI) CMOS image sensor is one type of CMOS image sensors. The BSI CMOS image sensor is operable to detect light projected onto its backside. The BSI CMOS image sensor can shorten optical paths and increase a fill factor to improve light sensitivity per unit area and quantum efficiency, and can reduce crosstalk and photo response non-uniformity. Hence, the image quality of the CMOS image sensor can be significantly improved. Furthermore, the BSI CMOS image sensor has a high chief ray angle, which allows a smaller lens height to be implemented, so that thinner camera modules are achieved. Accordingly, the BSI CMOS image sensor technology is becoming a mainstream technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
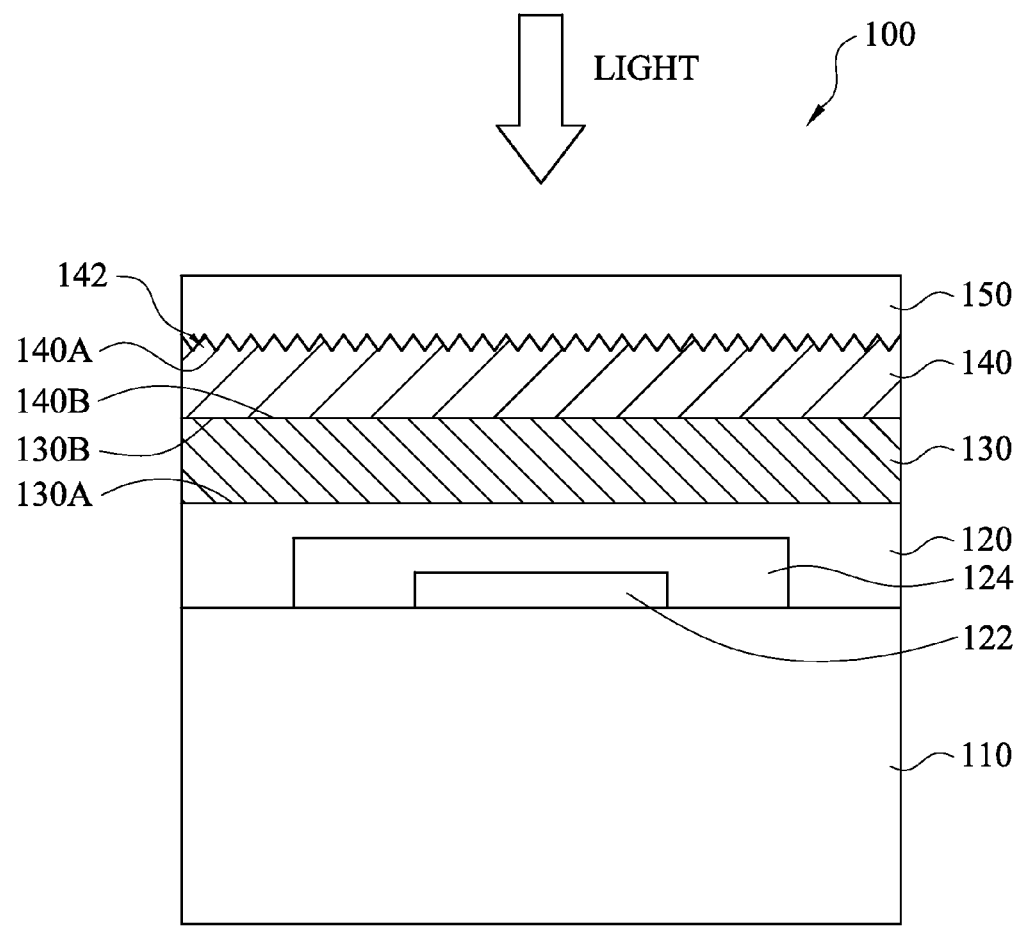
FIG. 1 is a schematic cross-sectional view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Terms used herein are only used to describe the specific embodiments, which are not used to limit the claims appended herewith. For example, unless limited otherwise, the term "a", "an" or "the" of the single form may also represent the plural form.

Further, spatially relative terms, such as "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures.

Embodiments of the present disclosure are directed to providing a BSI CMOS image sensor device with two semiconductor layers bonded to each other. In the BSI CMOS image sensor device, one of the semiconductor layers is formed with no device layer formed thereon, and is implanted and then annealed before being bonded to the other semiconductor layer. In the present disclosure, the implantation and annealing processes are performed without involving the device layer, and therefore, damages to the device layer can be avoided. In addition, because the device layer is not involved in the annealing process, the annealing process may be performed with a relatively high temperature to repair the damages of the semiconductor layer caused by the implantation process. Therefore, incident light absorption capability and the quantum efficiency of the BSI CMOS image sensor can be improved.

FIG. 1 is schematic cross-sectional view of a semiconductor device 100 in accordance with various embodiments. The semiconductor device 100 is a BSI CMOS image sensor device operated for sensing incident light. As shown in FIG. 1, the semiconductor device 100 includes a carrier wafer 110, a device layer 120, semiconductor layers 130 and 140, microstructures 142 and a dielectric layer 150. The carrier wafer 110 may include a material such as silicon or glass, but is not limited thereto. Further, in some embodiments, the carrier wafer 110 may include another semiconductor material such as germanium, silicon germanium, gallium arsenide, combinations thereof, or the like.

The device layer 120 is disposed on the carrier wafer 110. The device layer 120 includes a light-sensing portion 122 for sensing incident light and a circuit portion 124 for electrical interconnection with the light-sensing portion 122. In some embodiments, the light-sensing portion 122 may include a photo-sensitive element such as a photodiode, a pinned photodiode, a partially pinned photodiode, a photogate, a photo transistor, or the like. The circuit portion 124 may include conductive features and transistors such as a reset transistor, a source follower transfer, a row select transistor and/or a transfer transistor. In some embodiments, the conductive features may include a conductive material such as aluminum, aluminum alloy, copper, copper alloy, titanium, titanium nitride, polysilicon, metal silicide, combinations thereof, or the like. Further, in some embodiments, a passivation layer (not shown) may be additionally formed between the device layer 120 and the carrier wafer 110.

The semiconductor layer 130 is disposed on the device layer 120. The semiconductor layer 130 has a first side face 130A and a second side face 130B opposite to the first side face 130A, in which the first side face 130A is adjacent to the device layer 120. In some embodiments, the semiconductor layer 130 is an epitaxial silicon layer. In various embodiments, the semiconductor layer 130 may include a semiconductor material such as silicon, germanium, epitaxial germanium, combinations thereof, or the like.

The semiconductor layer 140 is disposed on the semiconductor layer 130. The semiconductor layer 140 has a third side face 140A and a fourth side face 140B opposite to the third side face 140A, and the fourth side face 140B is adjacent to the second side face 130B of the semiconductor layer 130. In some embodiments, the semiconductor layer 140 is an epitaxial silicon layer. In some embodiments, the semiconductor layer 140 may include a semiconductor material such as silicon, germanium, epitaxial germanium, combinations thereof, or the like. Specifically, the semiconductor layer 140 and the semiconductor layer 130 are combined by van der Waals forces. In some embodiments, the material forming the semiconductor layer 140 is substantially the same as that forming the semiconductor layer 130.

In FIG. 1, the microstructures 142 are disposed on the third side face 140A of the semiconductor layer 140 for enhancing incident light absorption in the semiconductor layer 140. The material forming the microstructures 142 may be the same as that forming the semiconductor layer 140. In some embodiments, as shown in FIG. 1, the microstructures 142 are regularly arranged, any two adjacent ones of the microstructures 142 adjoin to each other, and each microstructure 142 has a cross-section in a shape of triangle. In some embodiments, the microstructures 142 may be irregularly arranged. In some embodiments, any two adjacent ones of the microstructures 142 are separated from each other. Further, in some embodiments, each microstructure 142 may have a cross-section in a shape of trapezoid or arc, such as semi-circle or semi-ellipse, or another suitable shape.

It is noted the semiconductor layer 140 and the microstructures 142 are implanted and annealed for achieving high concentration gradient. In some embodiments, the refractive index of the dielectric layer 150 is smaller than that of the microstructures 142.

The dielectric layer 150 is disposed on the microstructures 142 and the semiconductor layer 140. In some embodiments, the dielectric layer 150 may include a transparent material such as silicon oxide, silicon nitride, combinations thereof, or the like.

Further, in some embodiments, a color filter layer and a micro-lens may be sequentially formed on the dielectric layer 150. The color filter layer includes a color filter, such as a red color filter, a green color filter or a blue color filter. The color filter layer may be formed by an exposure and development process, and the micro-lens may be formed in various arrangements and various shapes in accordance with a refractive index of the micro-lens and a distance between the light-sensing portion 122 and the micro-lens.

Figure 2:
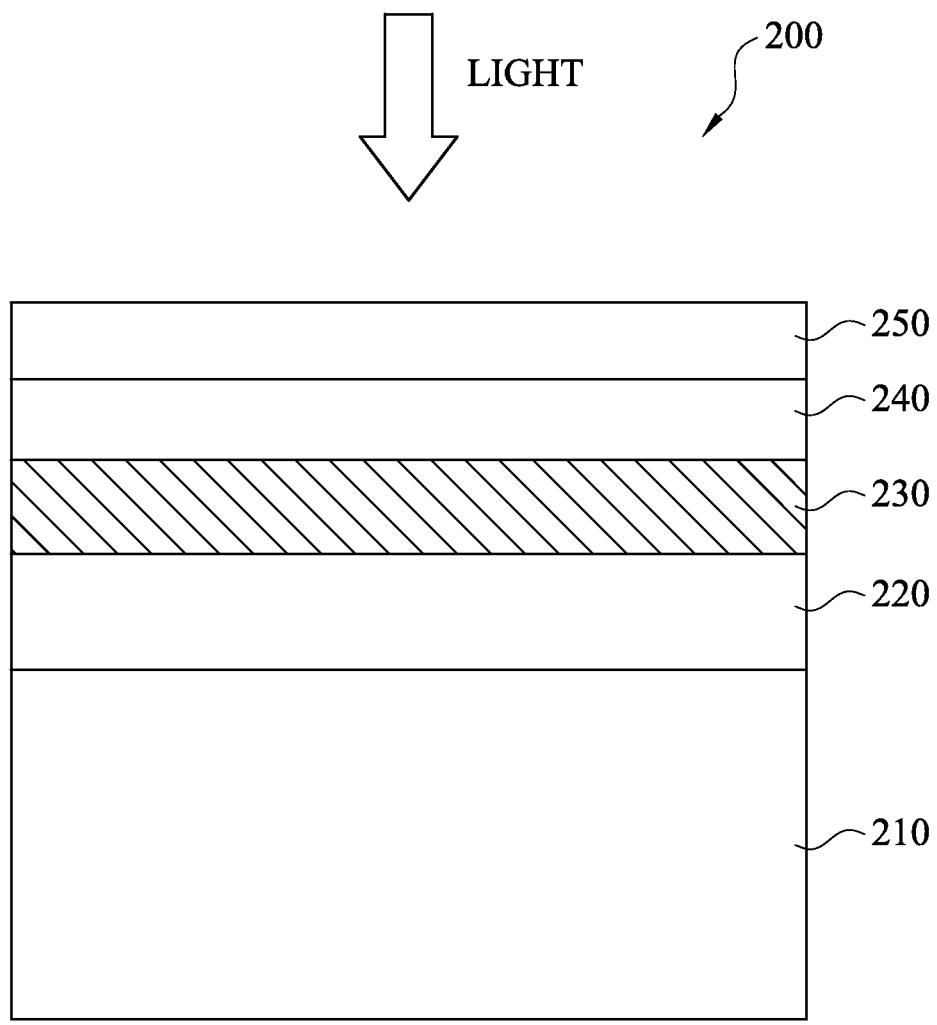
FIG. 2 is a schematic cross-sectional view of a semiconductor device in accordance with various embodiments.

FIG. 2 is schematic cross-sectional view of a semiconductor device 200 in accordance with various embodiments. The semiconductor device 200 is also a BSI CMOS image sensor device operated for sensing incident light. As shown in FIG. 1, the semiconductor device 200 includes a carrier wafer 210, a device layer 220, semiconductor layers 230, 240 and a dielectric layer 250. The difference between the semiconductor device 200 and the semiconductor device 100 is that no microstructures are disposed between the semiconductor layer 240 and the dielectric layer 250 in the semiconductor device 200. Since the carrier wafer 210, the device layer 220, the semiconductor layers 230 and 240 and the dielectric layer 250 are essentially the same as the carrier wafer 110, the device layer 120, the semiconductor layers 130, 140 and the dielectric layer 150 respectively, the details thereof are not described again herein.

Figure 3A:
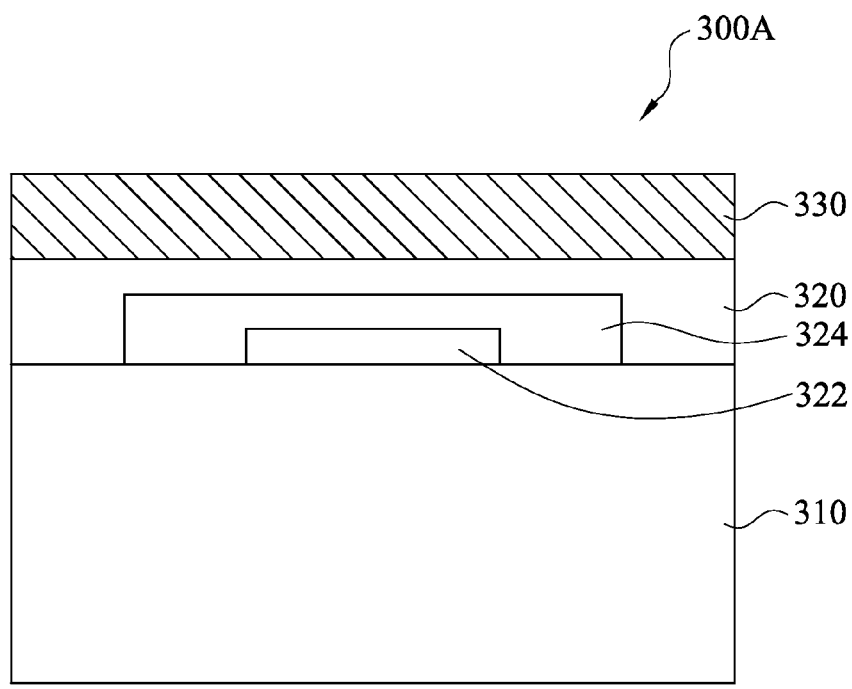
FIG. 3A through FIG. 3D are schematic cross-sectional views of intermediate stages illustrating a method for fabricating a semiconductor device in accordance with various embodiments.

Referring to FIG. 3A through FIG. 3D, FIG. 3A through FIG. 3D are schematic cross-sectional views of intermediate stages illustrating a method for fabricating a semiconductor device in accordance with various embodiments. As shown in FIG. 3A, a first semiconductor structure 300A, which includes a carrier wafer 310, a device layer 320 and a semiconductor layer 330, is provided. The carrier wafer 310 may be formed including a material such as silicon or glass, but is not limited thereto. Further, in some embodiments, the carrier wafer 310 may be formed including another semiconductor material such as germanium, silicon germanium, gallium arsenide, combinations thereof, or the like. The device layer 320 and the semiconductor layer 330 are sequentially formed on the carrier wafer 310. The device layer 320 is formed including a light-sensing portion 322 for sensing incident light and a circuit portion 324 for electrical interconnection with the light-sensing portion 322. In some embodiments, the light-sensing portion 322 may be formed including a photo-sensitive element such as a photodiode, a pinned photodiode, a partially pinned photodiode, a photogate, photo transistor, or the like, and the circuit portion 324 may be formed including conductive features and transistors such as reset transistor, source follower transfer, row select transistor and/or transfer transistor. In some embodiments, the conductive features may be formed including a conductive material such as aluminum, aluminum alloy, copper, copper alloy, titanium, titanium nitride, polysilicon, metal silicide, combinations thereof, or the like. In some embodiments, the light-sensing portion 322 may be formed utilizing a diffusion process or an ion implantation process.

The semiconductor layer 330 is formed on the side face of the device layer 320 far away from the carrier wafer 310. In some embodiments, the semiconductor layer 330 is an epitaxial silicon layer. In some embodiments, the semiconductor layer 330 may include a semiconductor material such as silicon, germanium, epitaxial germanium, combinations thereof, or the like. In some embodiments, the device layer 320 is firstly formed on the semiconductor layer 330, and then the side face of the device layer 320 far away from the semiconductor layer 330 is adhered to the carrier wafer 310 by using, for example, a bonding technique.

Figure 3B:
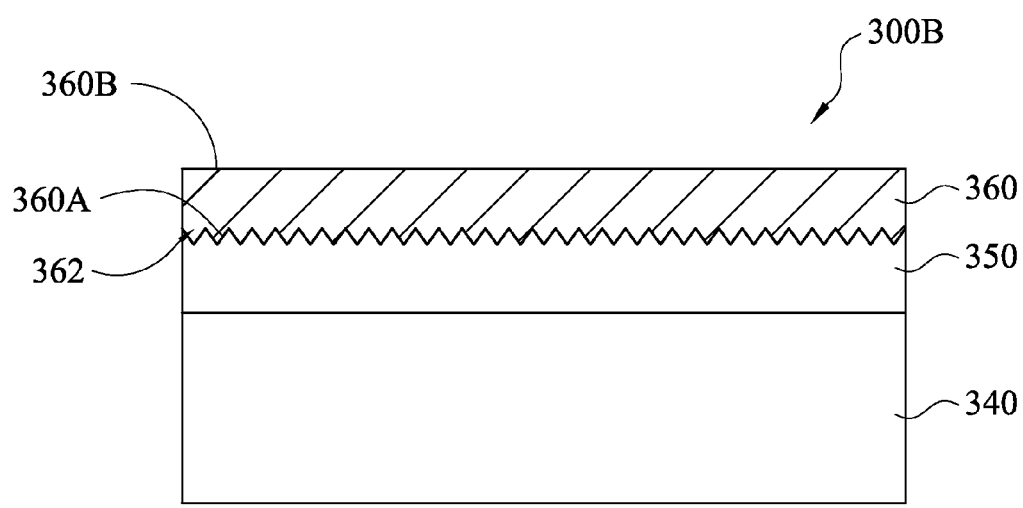

In FIG. 3B, a second semiconductor structure 300B, which includes a substrate 340, a dielectric layer 350 and a semiconductor layer 360, is provided. The substrate 340 may be formed including, but not limited to, glass or a semiconductor material such as silicon, germanium, or the like. The dielectric layer 350 is formed on the substrate 340. In some embodiments, the dielectric layer 350 may include a transparent material such as silicon oxide, silicon nitride, combinations thereof, or the like. In some embodiments, the dielectric layer 350 is formed by a deposition process such as chemical vapor deposition (CVD), physical vapor deposition (PVD), atomic layer deposition (ALD), combinations thereof, or the like. Then, as shown in FIG. 3B, the side face of the dielectric layer 350 far away from the substrate 340 is formed including a shaped pattern. The shaped pattern of the dielectric layer 350 may be formed by removing a portion of the dielectric layer 350 utilizing a photolithography process and an etching process. In some embodiments, the shaped pattern of the dielectric layer 350 is formed by using a laser removing technique.

After the shaped pattern of the dielectric layer 350 is formed, the semiconductor layer 360 is formed on the shaped pattern of the dielectric layer 350. In some embodiments, the semiconductor layer 360 is an epitaxial silicon layer. In some embodiments, the semiconductor layer 360 may include a semiconductor material such as silicon, germanium, epitaxial germanium, combinations thereof, or the like. The semiconductor layer 360 has a first side face 360A and a second side face 360B opposite to the first side face 360A. Microstructures 362 are formed on the first side face 360A, and the second side face 360B is far away from the dielectric layer 350. The shape and arrangement of the microstructures 362 is determined in accordance with the shaped pattern of the dielectric layer 350. In some embodiments, as shown in FIG. 3B, the microstructures 362 are formed regularly arranged, any two adjacent ones of the microstructures 362 are formed adjoining to each other, and each microstructure 362 is formed having a cross-section in a shape of triangle. In some embodiments, the microstructures 362 are formed irregularly arranged. In some embodiments, any two adjacent ones of the microstructures 362 are formed separated from each other. Further, in some embodiments, each microstructure 362 may be formed having a cross-section in a shape of trapezoid or arc, such as semicircle or semi-ellipse, or another suitable shape. In some embodiments, a refractive index of the dielectric layer 350 is smaller than that of the microstructures 362.

After the semiconductor layer 360 and the microstructures 362 are formed, an implantation process and an annealing process are sequentially performed on the microstructures 362 and/or the semiconductor layer 360. The annealing process may be performed utilizing a laser-annealing technique, a rapid thermal annealing (RTA) technique, or the like. The implantation process is performed to implant ions into the microstructures 362 and/or the semiconductor layer 360, and the annealing process is performed to anneal out damages to the microstructures 362 and/or the semiconductor layer 360 caused by the implantation process. The annealing process may be performed in a high temperature environment since no conductive features are present in the second semiconductor structure 300B.

In some alternative embodiments, the dielectric layer 350 may be formed without the shaped pattern. In other words, the side face of the dielectric layer 350 far away from the substrate 340 may be formed planar, such that no microstructures 362 are formed on the first side face 360A of the semiconductor layer 360.

Figure 3C:
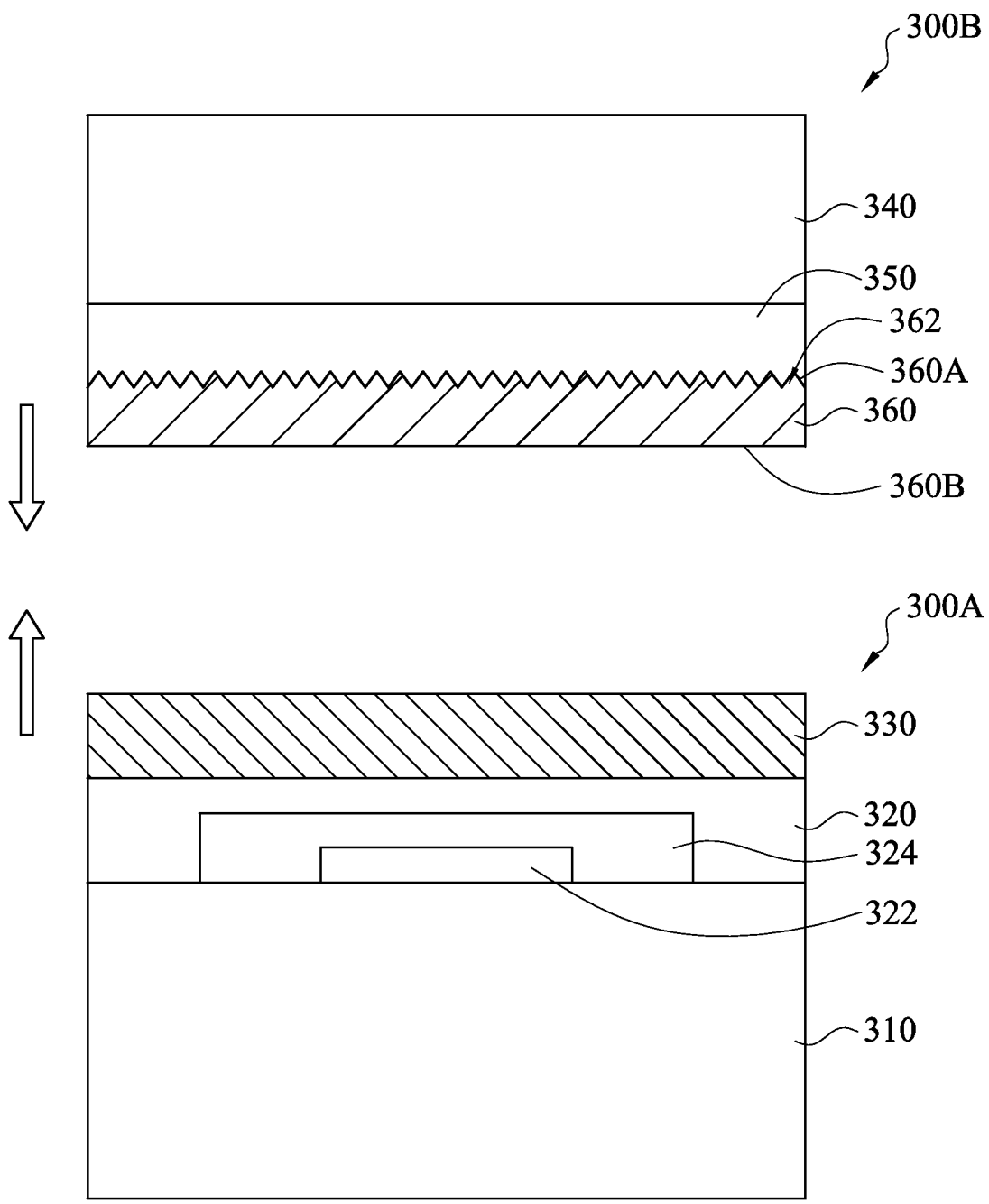

In FIG. 3C, the first semiconductor structure 300A and the second semiconductor structure 300B are to be bonded together. In detail, as shown in FIG. 3C, the second side face 360B of the semiconductor layer 360 is to be adjacent to the side face of the semiconductor layer 330 far away from the device layer 320. Specifically, the semiconductor layer 360 and the semiconductor layer 330 are combined by van der Waals forces. In some embodiments, the material forming the semiconductor layer 360 is substantially the same as that forming the semiconductor layer 330.

Figure 3D:
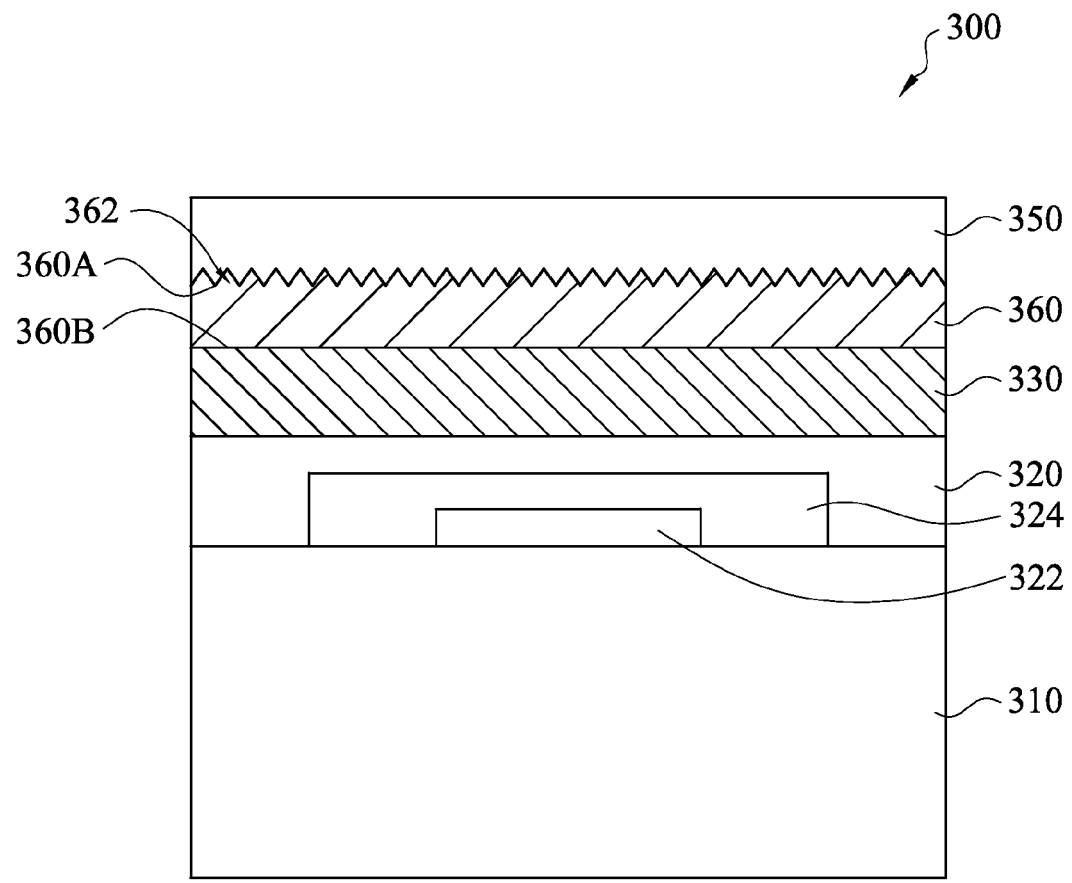

After the second semiconductor structure 300B is bonded to the first semiconductor structure 300A, the substrate 340 is then removed, as shown in FIG. 3D. In detail, a thinning operation is performed to remove the substrate 340 by using, for example, a chemical mechanical polishing (CMP) technique, an etching technique such as wet etching or dry etching, or the like. In some embodiments, the thinning operation is performed to also remove a portion of the dielectric layer 350.

In some embodiments, after the thinning operation is performed, a color filter layer and a micro-lens are sequentially formed on the dielectric layer 350. The color filter layer is formed including a color filter, such as a red color filter, a green color filter or a blue color filter. The color filter layer may be formed by an exposure and development process, and the micro-lens may be formed in various arrangements and various shapes in accordance with a refractive index of the micro-lens and a distance between the light-sensing portion 322 and the micro-lens.

Figure 4:
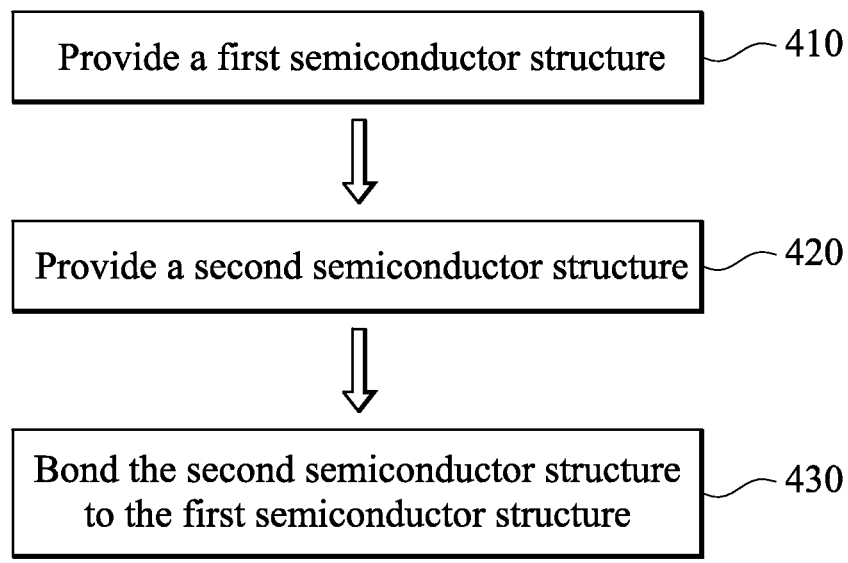
FIG. 4 is a flowchart illustrating a method for fabricating a semiconductor device in accordance with various embodiments.

Referring to FIG. 4 with FIG. 3A through FIG. 3D, FIG. 4 is a flow chart of a method for fabricating a semiconductor device in accordance with various embodiments. The method begins at operation 410, where a first semiconductor structure 300A is provided. As shown in FIG. 3A, the first semiconductor structure 300A includes a carrier wafer 310, a device layer 320 and a semiconductor layer 330. The device layer 320 and the semiconductor layer 330 are sequentially formed on the carrier wafer 310. The device layer 320 is formed including a light-sensing portion 322 for sensing incident light and a circuit portion 324 for electrical interconnection with the light-sensing portion 322. In some embodiments, the light-sensing portion 322 may be formed by a diffusion process or an ion implantation process. In some embodiments, the device layer 320 is firstly formed on the semiconductor layer 330, and then the side face of the device layer 320 far away from the semiconductor layer 330 is adhered to the carrier wafer 310 by using, for example, a bonding technique.

At operation 420, a second semiconductor structure 300B is provided. As shown in FIG. 3B, the second semiconductor structure 300B includes a substrate 340, a dielectric layer 350 and a semiconductor layer 360. The dielectric layer 350 may be formed on the substrate 340 by a deposition process such as CVD, PVD, ALD, combinations thereof, or the like. Then, the side face of the dielectric layer 350 far from the substrate 340 is formed including a shaped pattern. The shaped pattern of the dielectric layer 350 may be formed by removing a portion of the dielectric layer 350 utilizing a photolithography process and an etching process. In some embodiments, the shaped pattern of the dielectric layer 350 is formed by using a laser removing technique. The semiconductor layer 360 is formed on the shaped pattern of the dielectric layer 350 after the shaped pattern of the dielectric layer 350 is formed. The semiconductor layer 360 has a first side face 360A and a second side face 360B opposite to the first side face 360A. Microstructures 362 are formed on the first side face 360A, and the second side face 360B is far away from the dielectric layer 350. The shape of the microstructures 360 is determined in accordance with the shaped pattern of the dielectric layer 350. Then, an implantation process and an annealing process are sequentially performed on the semiconductor layer 360 and the microstructures 362 after the semiconductor layer 360 is formed. The implantation process is performed to implant ions into the microstructures 362 and/or the semiconductor layer 360, and the annealing process is performed to anneal out damages to the microstructures 362 and/or the semiconductor layer 360 caused by the implantation process.

In some alternative embodiments, the dielectric layer 350 may be formed without the shaped pattern. In other words, the side face of the dielectric layer 350 far away from the substrate 340 may be formed planar, such that no microstructures 362 are formed on the first side face 360A of the semiconductor layer 360.

At operation 430, the first semiconductor structure 300A and the second semiconductor structure 300B are operative to be bonded together. In detail, as shown in FIG. 3C, the second side face 360B of the semiconductor layer 360 is to be adjacent to the side face of the semiconductor layer 330 far away from the device layer 320. Specifically, the semiconductor layer 360 and the semiconductor layer 330 are combined by van der Waals forces. In some embodiments, the material forming the semiconductor layer 360 is substantially the same as that forming the semiconductor layer 330. After the second semiconductor structure 300B is bonded to the first semiconductor structure 300A, the substrate 340 is then removed, as shown in FIG. 3D. In detail, a thinning operation is performed to remove the substrate 340 by using, for example, a CMP technique, an etching technique such as wet etching or dry etching, or the like. In some embodiments, the thinning operation is performed to also remove a portion of the dielectric layer 350.

In some embodiments, after the thinning operation is performed, a color filter layer and a micro-lens are sequentially formed on the dielectric layer 350. The color filter layer is formed including a color filter, such as a red color filter, a green color filter or a blue color filter. The color filter layer may be formed by an exposure and development process. The micro-lens may be formed in various arrangements and various shapes in accordance with a refractive index of the micro-lens and a distance between the light-sensing portion 322 and the micro-lens.

Figure 5A:
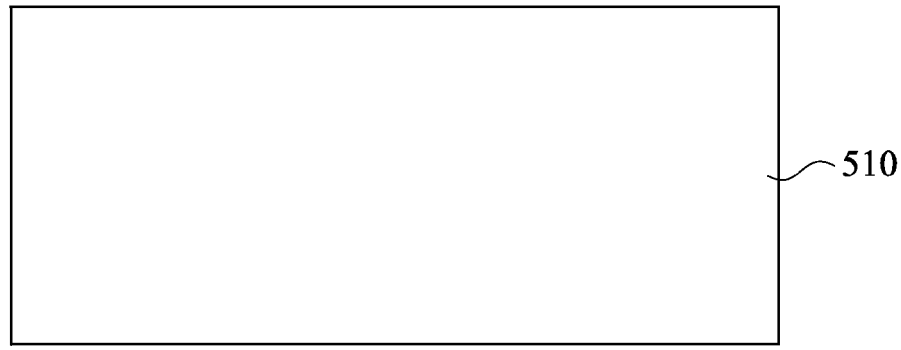
FIG. 5A through FIG. 5H are schematic cross-sectional views of intermediate stages illustrating a method for fabricating a semiconductor device in accordance with various embodiments.

Referring to FIG. 5A through FIG. 5H, FIG. 5A through FIG. 5H are schematic cross-sectional views of intermediate stages illustrating a method for fabricating a semiconductor device in accordance with various embodiments. In FIG. 5A, a carrier wafer 510 is provided. The carrier wafer 510 may be formed including a material such as silicon or glass, but is not limited thereto. Further, in some embodiments, the carrier wafer 510 may be formed including another semiconductor material such as germanium, silicon germanium, gallium arsenide, combinations thereof, or the like.

Figure 5B:
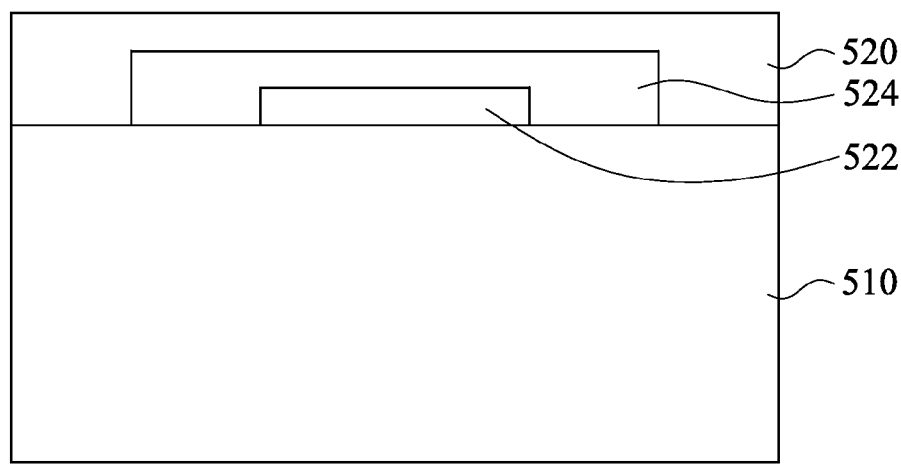

In FIG. 5B, the device layer 520 is formed on the carrier wafer 510. As shown in FIG. 5B, the device layer 520 is formed including a light-sensing portion 522 for sensing incident light and a circuit portion 524 for electrical interconnection with the light-sensing portion 522. In some embodiments, the light-sensing portion 522 may be formed including a photo-sensitive element such as a photodiode, a pinned photodiode, a partially pinned photodiode, a photo-gate, a photo transistor, or the like, and the circuit portion 524 may be formed including conductive features and transistors such as reset transistor, source follower transfer, row select transistor and/or transfer transistor. In some embodiments, the light-sensing portion 522 may be formed by a diffusion process or an ion implantation process.

Figure 5C:
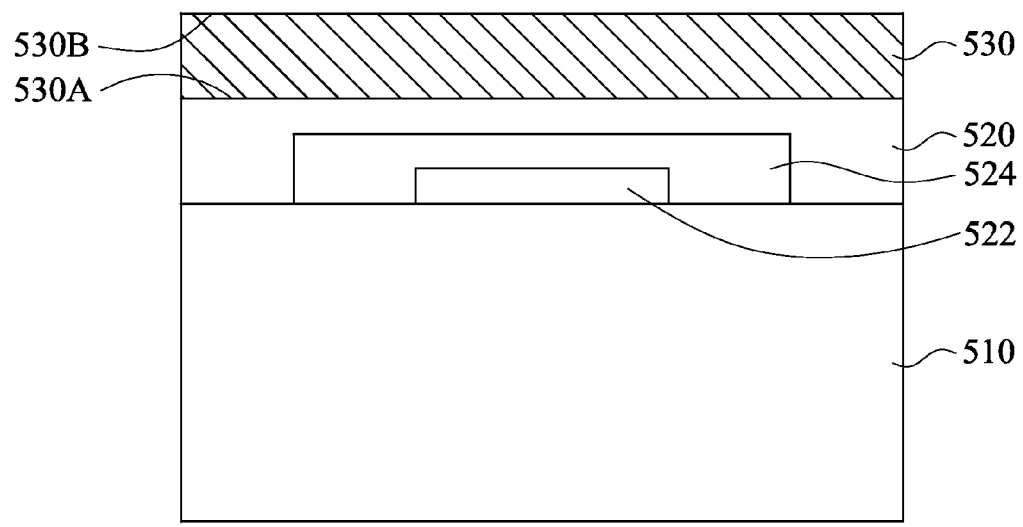

In FIG. 5C, the semiconductor layer 530 is formed on the side face of the device layer 520 far away from the carrier wafer 510. In detail, as shown in FIG. 5C, the semiconductor layer 530 has a first side face 530A and a second side face 530B opposite to the first side face 530A, in which the first side face 530A is adjacent to the device layer 520. In some embodiments, the semiconductor layer 530 is an epitaxial silicon layer. In some embodiments, the semiconductor layer 530 may include a semiconductor material such as silicon, germanium, epitaxial germanium, combinations thereof, or the like.

Figure 5D:

In FIG. 5D, a substrate 540 is provided. The substrate 540 may be formed including, but not limited to, glass or a semiconductor material such as silicon, germanium, or the like.

Figure 5E:
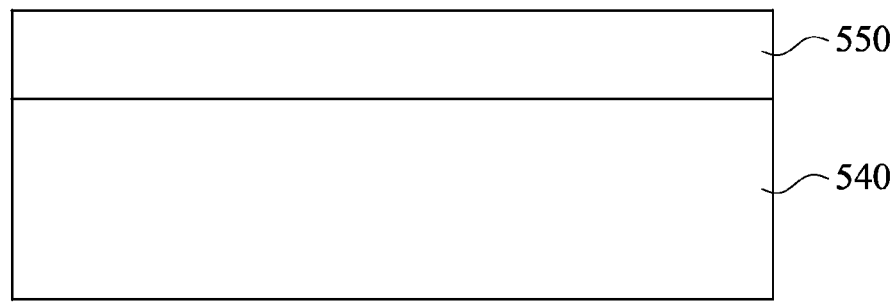

In FIG. 5E, the dielectric layer 550 is formed on the substrate 540. In some embodiments, the dielectric layer 550 may be formed including a transparent material such as silicon oxide, silicon nitride, combinations thereof, or the like. In some embodiments, the dielectric layer 550 is formed by a deposition process such as CVD, PVD, ALD, combinations thereof, or the like.

Figure 5F:
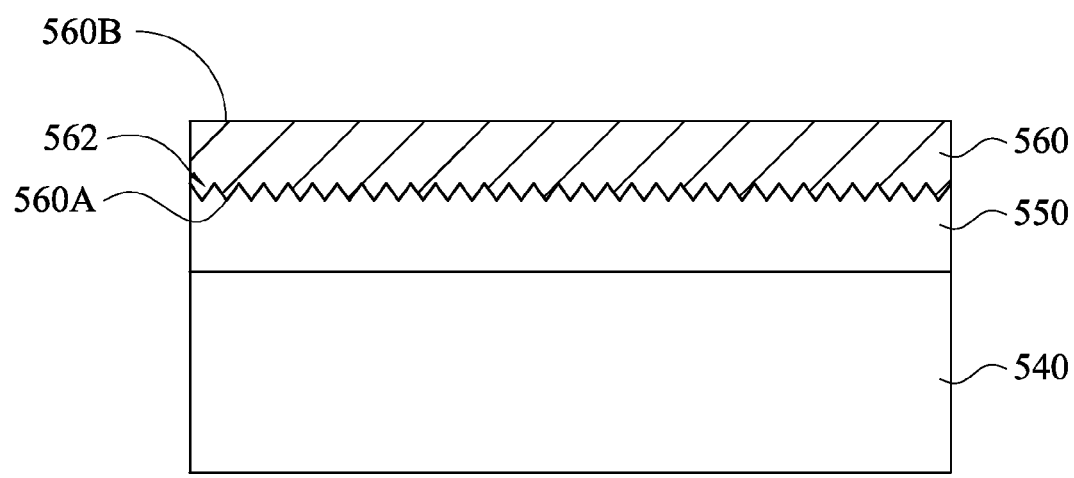

In FIG. 5F, the side face of the dielectric layer 550 far away from the substrate 540 is formed including a shaped pattern. The shaped pattern of the dielectric layer 550 may be formed by removing a portion of the dielectric layer 550 utilizing a photolithography process and an etching process. In some embodiments, the shaped pattern of the dielectric layer 550 is formed by using a laser removing technique. After the shaped pattern of the dielectric layer 550 is formed, the semiconductor layer 560 is then formed on the shaped pattern of the dielectric layer 550. In some embodiments, the semiconductor layer 560 is an epitaxial silicon layer. In some embodiments, the semiconductor layer 560 may include a semiconductor material such as silicon, germanium, epitaxial germanium, combinations thereof, or the like. The semiconductor layer 560 has a third side face 560A and a fourth side face 560B opposite to the third side face 560A. Microstructures 562 are formed on the third side face 560A, and the fourth side face 560B is far away from the dielectric layer 550. The shape and arrangement of the microstructures 562 is determined in accordance with the shaped pattern of the dielectric layer 550.

In some embodiments, as shown in FIG. 5F, the microstructures 562 are formed regularly arranged regularly arranged, any two adjacent ones of the microstructures 562 are formed adjoining to each other, and each microstructure 562 is formed having a cross-section in a shape of triangle. In some embodiments, the microstructures 562 are formed irregularly arranged. In some embodiments, any two adjacent ones of the microstructures 562 are formed separated from each other. Further, in some embodiments, each microstructure 562 may be formed having a cross-section in a shape of trapezoid or arc, such as semi-circle or semi-ellipse, or other suitable shapes. In some embodiments, a refractive index of the dielectric layer 550 is smaller than that of the microstructures 562.

In some alternative embodiments, the dielectric layer 550 may be formed without the shaped pattern. In other words, the side face of the dielectric layer 550 far away from the substrate 540 may be formed planar, such that no microstructures 562 are formed on the third side face 560A of the semiconductor layer 560.

After the semiconductor layer 560 and the microstructures 562 are formed, an implantation process and an annealing process are sequentially performed on the microstructures 562 and/or the semiconductor layer 560. The implantation process is performed to implant ions into the microstructures 562 and/or the semiconductor layer 560, and the annealing process is performed to anneal out damages to the microstructures 562 and/or the semiconductor layer 560 caused by the implantation process. The annealing process may be performed utilizing a laser-annealing technique, an RTA technique, or the like. The annealing process may be performed in a high temperature environment for better annealing capability.

Figure 5G:
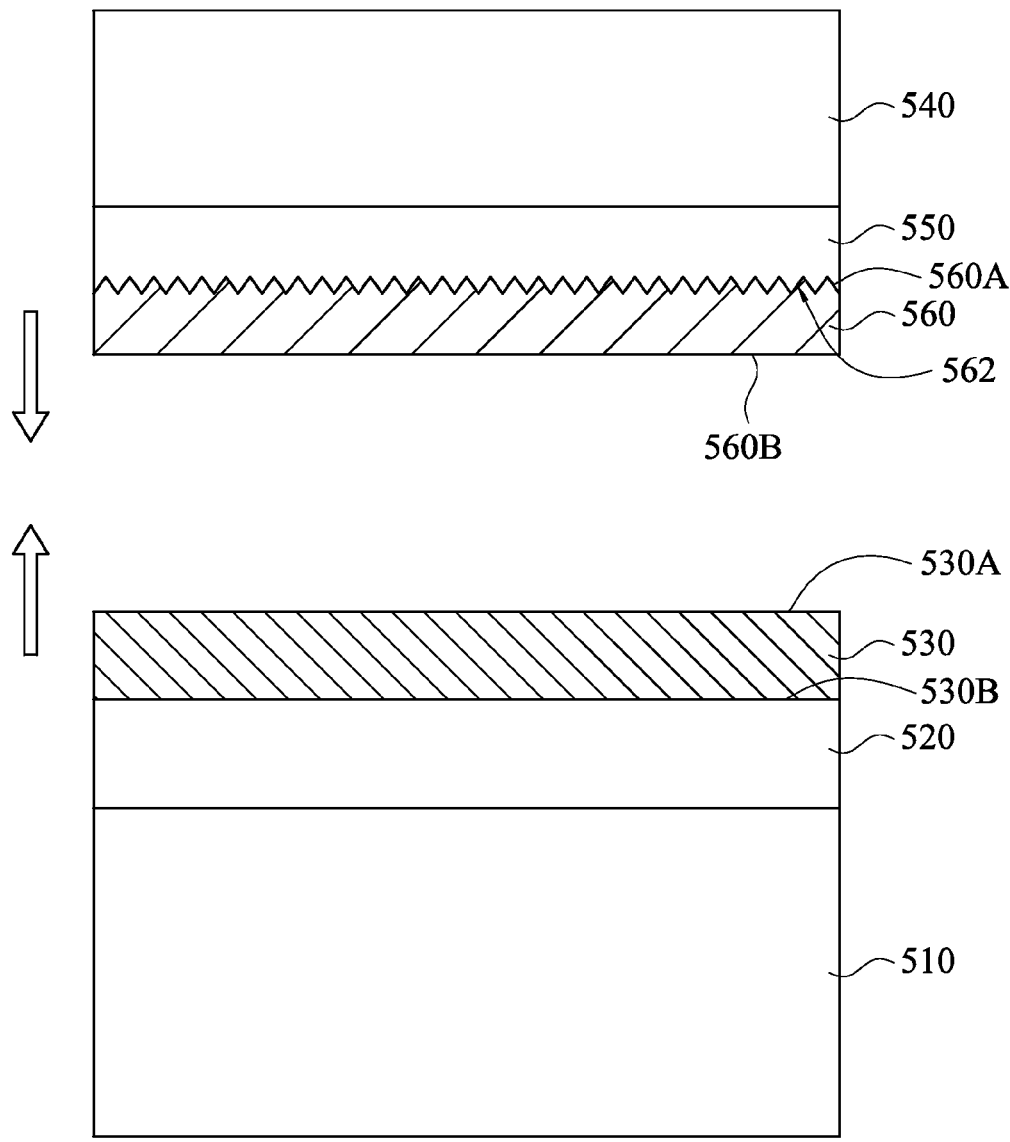

In FIG. 5G, the semiconductor layer 560 is to be bonded to the semiconductor layer 530. Specifically, the semiconductor layer 560 and the semiconductor layer 530 are combined by van der Waals forces. In some embodiments, the material forming the semiconductor layer 560 is substantially the same as that forming the semiconductor layer 530.

Figure 5H:
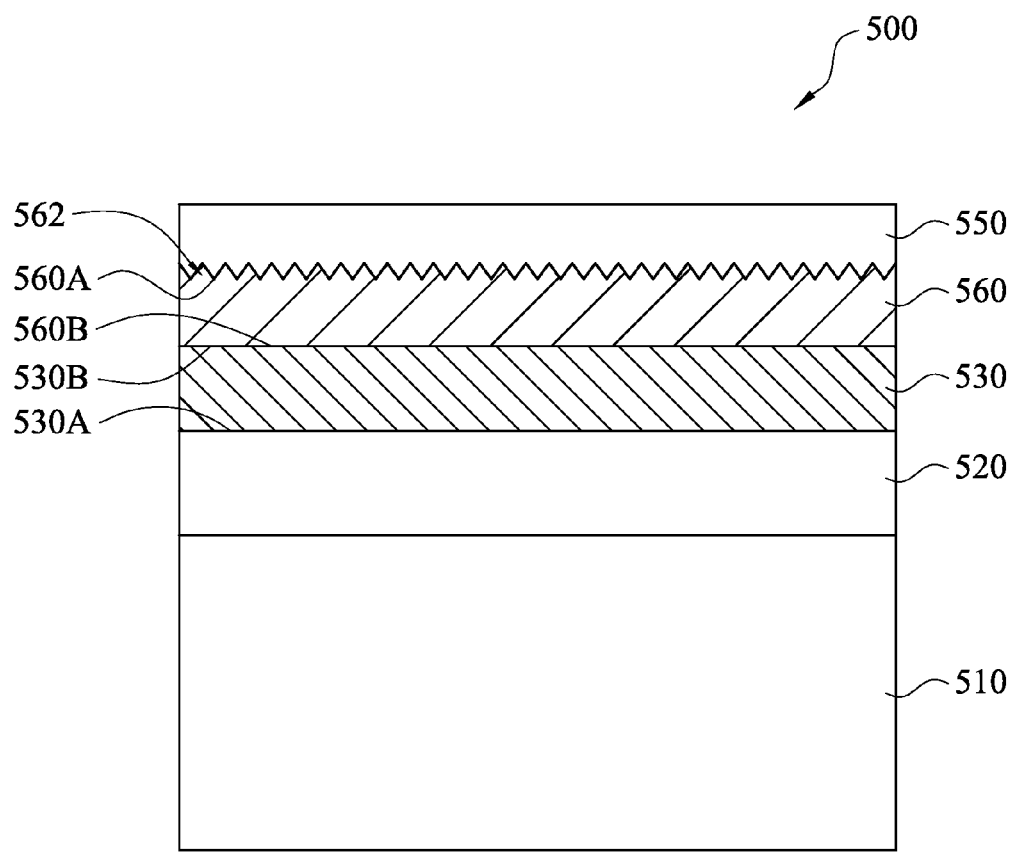

In FIG. 5H, the semiconductor layer 560 is bonded to the semiconductor layer 530, and the substrate 540 is then removed. In detail, the fourth side face 560B of the semiconductor layer 560 is adjacent to the second side face 530B of the semiconductor layer 530. Then, a thinning operation is performed to remove the substrate 540 by using, for example, a CMP technique, an etching technique such as wet etching, dry etching, or the like. In some embodiments, the thinning operation is performed to also remove a portion of the dielectric layer 550.

In some embodiments, after the thinning operation is performed, a color filter layer and a micro-lens are sequentially formed on the dielectric layer 550. The color filter layer is formed including a color filter, such as a red color filter, a green color filter or a blue color filter. The color filter layer may be formed utilizing an exposure and development process, and the micro-lens may be formed in various arrangements and various shapes in accordance with a refractive index of the micro-lens and a distance between the light-sensing portion 522 and the micro-lens.

Figure 6:
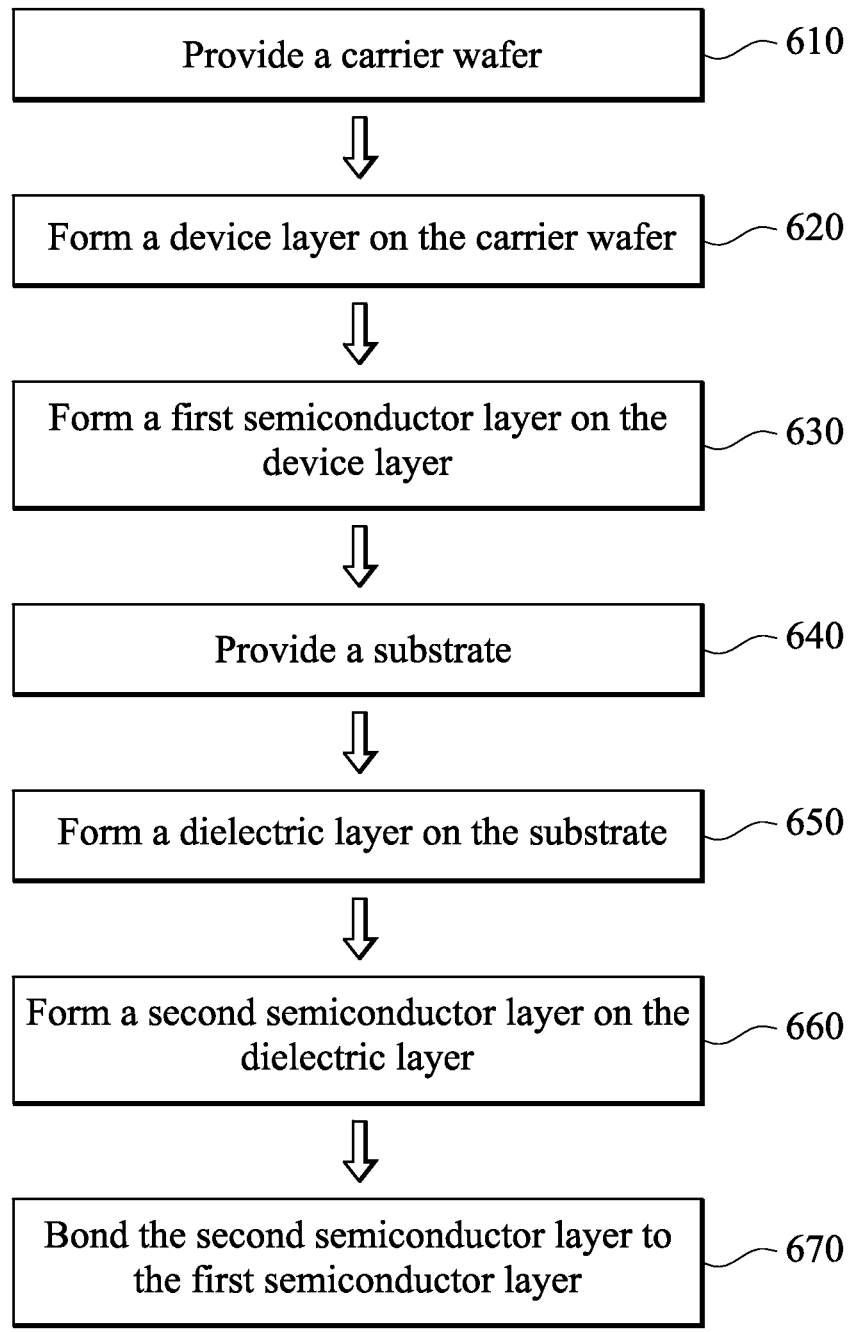
FIG. 6 is a flowchart illustrating a method for fabricating a semiconductor device in accordance with various embodiments.

Referring to FIG. 6 with FIG. 5A through FIG. 5H, FIG. 6 is a flow chart of a method for fabricating a semiconductor device in accordance with various embodiments. The method begins at operation 610, where a carrier wafer 510 is provided. The carrier wafer 510 may be formed including a material such as silicon or glass, or may be formed including another semiconductor material such as germanium, silicon germanium, gallium arsenide, combinations thereof, or the like.

At operation 620, the device layer 520 is formed on the carrier wafer 510. The device layer 520 includes a light-sensing portion 522 for sensing incident light and a circuit portion 524 for electrical interconnection with the light-sensing portion 522. The circuit portion 524 may be formed including conductive features and transistors. In some embodiments, the conductive features may be formed including a conductive material such as aluminum, aluminum alloy, copper, copper alloy, titanium, titanium nitride, polysilicon, metal silicide, combinations thereof, or the like. In some embodiments, the light-sensing portion 522 may be formed by a diffusion process or an ion implantation process.

At operation 630, the semiconductor layer 530 is formed on the side face of the device layer 520 far away from the carrier wafer 510. In detail, as shown in FIG. 5C, the semiconductor layer 530 has a first side face 530A and a second side face 530B opposite to the first side face 530A, in which the first side face 530A is adjacent to the device layer 520. In some embodiments, the semiconductor layer 530 is an epitaxial silicon layer. In some embodiments, the semiconductor layer 530 may be formed including a semiconductor material such as silicon, germanium, epitaxial germanium, combinations thereof, or the like.

At operation 640, a substrate 540 is provided. The substrate 540 may be formed including, but not limited to, glass or a semiconductor material such as silicon, germanium, or the like.

At operation 650, a dielectric layer 550 is formed on the substrate 540. The dielectric layer 550 may be formed on the substrate 540 utilizing a deposition process such as CVD, PVD, ALD, combinations thereof, or the like. In some embodiments, the side face of the dielectric layer 550 far away from the substrate 540 is formed including a shaped pattern. The shaped pattern of the dielectric layer 550 may be formed by removing a portion of the dielectric layer 550 utilizing a photolithography process and an etching process. In some embodiments, the shaped pattern of the dielectric layer 550 is formed utilizing a laser removing technique.

At operation 660, the semiconductor layer 560 is formed on the dielectric layer 550. In some embodiments, the semiconductor layer 560 is formed on the shaped pattern of the dielectric layer 550 after the shaped pattern of the dielectric layer 550 is formed. The semiconductor layer 560 has a third side face 560A and a fourth side face 560B opposite to the third side face 560A. The fourth side face 560B is far away from the dielectric layer 550. In some embodiments, the microstructures 562 are formed on the third side face 560A. The shape of the microstructures 560 is determined by the shaped pattern of the dielectric layer 550. Then, an implantation process and an annealing process are sequentially performed on the semiconductor layer 560 and/or the microstructures 562 after the semiconductor layer 560 is formed. The implantation process is performed to implant ions into the microstructures 562 and/or the semiconductor layer 560, and the annealing process is performed to anneal out damages to the microstructures 562 and/or the semiconductor layer 560 caused by the implantation process.

At operation 670, the semiconductor layer 560 is operative to be bonded to the semiconductor layer 530. In detail, as shown in FIG. 5G, the fourth side face 560B of the semiconductor layer 560 is to be adjacent to the second side face 530B of the semiconductor layer 530 far away from the device layer 520. Specifically, the semiconductor layer 560 and the semiconductor layer 530 are combined by van der Waals forces. In some embodiments, the material forming the semiconductor layer 560 is substantially the same as that forming the semiconductor layer 530. After the semiconductor layer 560 is bonded to the semiconductor layer 530, the substrate 540 is then removed, as shown in FIG. 5H. In detail, a thinning operation is performed to remove the substrate 540 by using, for example, a CMP technique, an etching technique such as wet etching, dry etching, or the like. In some embodiments, the thinning operation is performed to also remove a portion of the dielectric layer 550.

In some embodiments, after the thinning operation is performed, a color filter layer and a micro-lens are sequentially formed on the dielectric layer 550. The color filter layer is formed including a color filter, such as a red color filter, a green color filter or a blue color filter. The color filter layer may be formed utilizing an exposure and development process, and the micro-lens may be formed in various arrangements and various shapes in accordance with a refractive index of the micro-lens and a distance between the light-sensing portion 522 and the micro-lens.

In accordance with some embodiments, the present disclosure provides a semiconductor device, which includes a carrier wafer, a device layer, a first semiconductor layer and a second semiconductor layer. The device layer is disposed on the carrier wafer. The first semiconductor layer is disposed on the device layer. The first semiconductor layer has a first side face and a second side face opposite to the first side face. The first side face is adjacent to the device layer. The second semiconductor layer is disposed on the first semiconductor layer. The second semiconductor layer has a third side face and a fourth side face opposite to the third side face. The fourth side face of the second semiconductor layer is adjacent to the second side face of the first semiconductor layer, and the second semiconductor layer is implanted and annealed.

In accordance with some embodiments, the present disclosure discloses a method for fabricating a semiconductor device. In this method, a first semiconductor structure and a second semiconductor structure are provided. The first semiconductor structure has a carrier wafer on which a device layer and a first semiconductor layer are sequentially formed. The second semiconductor structure has a second semiconductor layer with a first side face and a second side face opposite to the first side face. Then, the second semiconductor structure is bonded to the first semiconductor structure. The second side face of the second semiconductor layer is adjacent to the first semiconductor layer. The second semiconductor layer is implanted and annealed before the operation of bonding the second semiconductor structure to the first semiconductor structure.

In accordance with some embodiments, the present disclosure discloses a method for fabricating a semiconductor device. In this method, a carrier wafer and a substrate are provided. A device layer is formed on the carrier wafer. A first semiconductor layer is formed on the device layer. The first semiconductor layer has a first side face and a second side face opposite to the first side face, in which the first side face is adjacent to the device layer. A dielectric layer is formed on the substrate. A second semiconductor layer is formed on the dielectric layer. The second semiconductor layer has a third side face and a fourth side face opposite to the third side face, in which the third side face is adjacent to the dielectric layer. The second semiconductor layer is bonded to the first semiconductor layer, in which the second side face of the first semiconductor layer is adjacent to the fourth side face of the second semiconductor layer. The second semiconductor layer is implanted and annealed before the operation of bonding the second semiconductor layer to the first semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, the method comprising:
   providing a first semiconductor structure, providing the first semiconductor structure comprising:
      forming a device layer on a first substrate, wherein the device layer comprises a light-sensing portion and a circuit portion; and
      forming a first semiconductor layer on the device layer;
   providing a second semiconductor structure, the second semiconductor structure having a second semiconductor layer with a first side and a second side opposite to the first side; and
   implanting and annealing the second semiconductor layer with no device layer formed thereon; and
   after implanting and annealing the second semiconductor layer, bonding the second semiconductor structure to the first semiconductor structure on which the device layer has been formed, wherein bonding the second semiconductor structure to the first semiconductor structure comprises bonding the second side of the second semiconductor layer to the first semiconductor layer, wherein the second semiconductor layer physically contacts the first semiconductor layer.

2. The method of claim 1, wherein the first semiconductor layer and the second semiconductor layer are epitaxial silicon layers.

3. The method of claim 1, before bonding the second semiconductor structure to the first semiconductor structure on which the device layer has been formed, the method further comprising:
   forming a plurality of microstructures on the first side of the second semiconductor layer; and
   forming a dielectric layer on and physically contacting the microstructures.

4. The method of claim 3, wherein the dielectric layer has a refractive index smaller than a refractive index of the microstructures.

5. The method of claim 3, wherein each of the microstructures is formed with a cross-section in a shape of a triangle, trapezoid, or arc.

6. The method of claim 3, wherein any two adjacent ones of the microstructures adjoin to each other.

7. The method of claim 3, wherein the microstructures are regularly arranged.

8. The method of claim 3, wherein implanting and annealing the second semiconductor layer comprises implanting and annealing the microstructures.

9. The method of claim 1, wherein providing the second semiconductor structure comprises:
   providing a second substrate;
   forming a dielectric layer on the second substrate; and
   forming the second semiconductor layer on the dielectric layer, wherein the first side of the second semiconductor layer is adjacent to the dielectric layer.

10. The method of claim 9, wherein providing the second semiconductor structure comprises:
    forming a plurality of microstructures on the dielectric layer, wherein the first side of the second semiconductor layer is adjacent to the microstructures.

11. The method of claim 9, further comprising:
    removing the second substrate after bonding the second semiconductor layer to the first semiconductor layer.

12. A method for fabricating a semiconductor device, the method comprising:
    providing a first substrate;
    forming a device layer on the first substrate, wherein the device layer comprises a light-sensing portion;
    forming a first semiconductor layer on the device layer, the first semiconductor layer having a first side and a second side opposite to the first side, wherein the first side is adjacent to the device layer;
    providing a second substrate;
    forming a dielectric layer on the second substrate;
    forming a second semiconductor layer on the dielectric layer, the second semiconductor layer having a third side and a fourth side opposite to the third side, wherein the third side is adjacent to the dielectric layer;
    implanting and annealing the second semiconductor layer with no device layer formed thereon; and
    after implanting and annealing the second semiconductor layer, bonding the second semiconductor layer to the first semiconductor layer, which has been formed on the device layer, wherein the second side of the first semiconductor layer physically contacts the fourth side of the second semiconductor layer.

13. The method of claim 12, wherein the first semiconductor layer and the second semiconductor layer are epitaxial silicon layers.

14. The method of claim 12, wherein the device further comprises a circuit portion.

15. The method of claim 12, further comprising:
removing the second substrate after bonding the second semiconductor layer to the first semiconductor layer.

16. The method of claim 12, further comprising:
forming a plurality of microstructures on the dielectric layer, wherein the third side of the second semiconductor layer is adjacent to the microstructures, and implanting and annealing the second semiconductor layer comprises implanting and annealing the microstructures.

17. The method of claim 16, wherein the dielectric layer has a refractive index smaller than a refractive index of the microstructures.

18. The method of claim 16, wherein each of the microstructures is formed with a cross-section in a shape of a triangle, trapezoid, or arc.

19. The method of claim 16, wherein the microstructures are regularly arranged.

20. A method for fabricating a semiconductor device, the method comprising:
providing a first semiconductor structure, providing the first semiconductor structure comprising:
forming a device layer on a first substrate, wherein the device layer comprises a light-sensing portion and a circuit portion; and
forming a first semiconductor layer on and completely covering the device layer;
providing a second semiconductor structure, the second semiconductor structure having a second semiconductor layer with a first side and a second side opposite to the first side; and
implanting and annealing the second semiconductor layer with no device layer formed thereon; and
after implanting and annealing the second semiconductor layer, bonding the second semiconductor structure to the first semiconductor structure on which the device layer has been formed, wherein the second semiconductor layer physically contacts the first semiconductor layer.

* * * * *